US012772527B2

(12) United States Patent
Narushima

(10) Patent No.: US 12,772,527 B2
(45) Date of Patent: Oct. 20, 2026

(54) FILM FORMING METHOD, METHOD OF MANUFACTURING SEMICONDUCTOR DEVICE, AND FILM FORMING APPARATUS

(71) Applicant: Tokyo Electron Limited, Tokyo (JP)

(72) Inventor: Kensaku Narushima, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 715 days.

(21) Appl. No.: 17/822,472

(22) Filed: Aug. 26, 2022

(65) Prior Publication Data

US 2023/0076867 A1 Mar. 9, 2023

(30) Foreign Application Priority Data

Sep. 8, 2021 (JP) ................................ 2021-146056

(51) Int. Cl.
*H10D 64/01* (2025.01)
*C23C 16/42* (2006.01)
(Continued)

(52) U.S. Cl.
CPC ......... *H10D 64/0112* (2026.01); *C23C 16/42* (2013.01); *C23C 16/45553* (2013.01); (Continued)

(58) Field of Classification Search
CPC ......... H01L 21/28518; H01L 21/76843; H01L 21/76879; H01L 21/28562; C23C 16/42; C23C 16/45553; C23C 16/4584; C23C 16/46; C23C 16/04; C23C 16/045; C23C 16/45534; C23C 16/45567; C23C 16/30; C23C 16/45561; C30B 29/06;
(Continued)

(56) References Cited

U.S. PATENT DOCUMENTS 6,198,142 B1 * 3/2001 Chau .................... H10D 62/021
257/E29.267
6,524,952 B1 * 2/2003 Srinivas ............ H01L 21/76843
438/909
(Continued)

FOREIGN PATENT DOCUMENTS

JP H11-238698 A 8/1999
JP 2004-253797 A 9/2004
(Continued)

OTHER PUBLICATIONS

Rhee et al., "Formation of TiSi2 Thin Films from Chemical Vapor Deposition Using TiI4", Journal of the Korean Physical Society, Nov. 1998, vol. 33, pp. S121-S124.
(Continued)

*Primary Examiner* — Dale E Page
*Assistant Examiner* — Quovaunda Jefferson
(74) *Attorney, Agent, or Firm* — Armstrong Teasdale LLP

(57) ABSTRACT

A film forming method of forming a titanium silicide film in a contact forming region of a substrate includes: preparing the substrate having the contact forming region; and forming the titanium silicide film in the contact forming region of the substrate by atomic layer deposition (ALD) by sequentially supplying $TiI_4$ gas as a Ti precursor and a Si-containing gas as a reducing gas to the substrate.

14 Claims, 14 Drawing Sheets

(51) Int. Cl.

| | |
|---|---|
| ***C23C 16/455*** | (2006.01) |
| ***C23C 16/458*** | (2006.01) |
| ***C23C 16/46*** | (2006.01) |
| ***C30B 29/06*** | (2006.01) |
| ***C30B 29/52*** | (2006.01) |
| ***H10W 20/00*** | (2026.01) |

(52) U.S. Cl.
CPC .......... *C23C 16/4584* (2013.01); *C23C 16/46* (2013.01); *H10W 20/033* (2026.01); *H10W 20/057* (2026.01); *C30B 29/06* (2013.01); *C30B 29/52* (2013.01)

(58) Field of Classification Search
CPC ....... C30B 29/10; C30B 29/52; C30B 25/165; H10D 84/017; H10D 84/0186; H10D 64/0112; H10W 20/033; H10W 20/057; H10P 14/432
See application file for complete search history.

(56) References Cited

U.S. PATENT DOCUMENTS

| | | | | |
|---|---|---|---|---|
| 6,888,252 | B2 * | 5/2005 | Derraa | H01L 23/485<br>257/E21.585 |
| 6,911,391 | B2 * | 6/2005 | Yang | H01J 37/3244<br>438/653 |
| 7,795,109 | B2 * | 9/2010 | Weis | H10B 63/80<br>257/296 |
| 8,557,627 | B2 * | 10/2013 | Oh | H10N 70/8825<br>438/102 |
| 8,785,310 | B2 * | 7/2014 | Hasegawa | C23C 16/42<br>438/581 |
| 8,945,305 | B2 * | 2/2015 | Marsh | H01L 21/02175<br>438/758 |
| 9,478,438 | B2 * | 10/2016 | Thombare | C23C 16/14 |
| 2006/0128142 | A1 * | 6/2006 | Whelan | B82Y 40/00<br>257/E21.171 |
| 2020/0347493 | A1 * | 11/2020 | Liu | C23C 16/34 |

FOREIGN PATENT DOCUMENTS

| | | | |
|---|---|---|---|
| JP | 2015-193864 | A | 11/2015 |
| JP | 2018-006753 | A | 1/2018 |
| JP | 2019-016773 | A | 1/2019 |
| KR | 10-2004-0059431 | A | 7/2004 |
| KR | 10-2005-0116433 | A | 12/2005 |
| KR | 10-2010-0056813 | A | 5/2010 |
| KR | 10-2018-0002766 | A | 1/2018 |
| KR | 10-2018-0061387 | A | 6/2018 |
| KR | 10-2259187 | B1 | 6/2021 |

OTHER PUBLICATIONS

Yanagihara et al., “Boron Redistribution during Silicidation Process of Titanium-Silicon System”, Journal of Surface Analysis, 1999, vol. 5, No. 1, pp. 128-131.

* cited by examiner

FILM FORMING METHOD, METHOD OF MANUFACTURING SEMICONDUCTOR DEVICE, AND FILM FORMING APPARATUS

CROSS-REFERENCE TO RELATED APPLICATION

This application is based upon and claims the benefit of priority from Japanese Patent Application No. 2021-146056, filed on Sep. 8, 2021, the entire contents of which are incorporated herein by reference.

TECHNICAL FIELD

The present disclosure relates to a film forming method, a method of manufacturing a semiconductor device, and a film forming apparatus.

BACKGROUND

Titanium silicide is used for a Si contact in a semiconductor device. Non-Patent Document 1 describes a method of sequentially depositing Ti and TiN on a Si substrate and then reacting Ti with Si of the substrate by annealing to form titanium silicide ($TiSi_2$). Patent Document 1 describes forming a $TiSi_2$ layer on a silicon substrate by an atomic layer deposition (ALD) method using $TiCl_4$ and $SiH_4$. In addition, Non-Patent Document 2 describes forming a $TiSi_2$ film by a chemical vapor deposition (CVD) method using $TiI_4$ and $SiH_4$.

PRIOR ART DOCUMENTS

Patent Document

Patent Document 1: Japanese Patent Laid-open Publication No. 2004-253797

Non-Patent Documents

Non-Patent Document 1: K. Yanagihara and S. Hayashi, "Boron Redistribution during Silicidation Process of Titanium-Silicon System," Journal of Surface Analysis, Vol. 5 No. 1 (1999)

Non-Patent Document 2: Hwa Sung Rhee, "Formation of TiSi2 Thin Films from Chemical Vapor Deposition Using TiI4," Journal of the Korean Physical Society, Vol. 33, November 1998, pp. S121-S124

SUMMARY

According to one embodiment of the present disclosure, there is provided a film forming method of forming a titanium silicide film in a contact forming region of a substrate. The film forming method includes: preparing the substrate having the contact forming region; and forming the titanium silicide film in the contact forming region of the substrate by atomic layer deposition (ALD) by sequentially supplying $TiI_4$ gas as a Ti precursor and a Si-containing gas as a reducing gas to the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
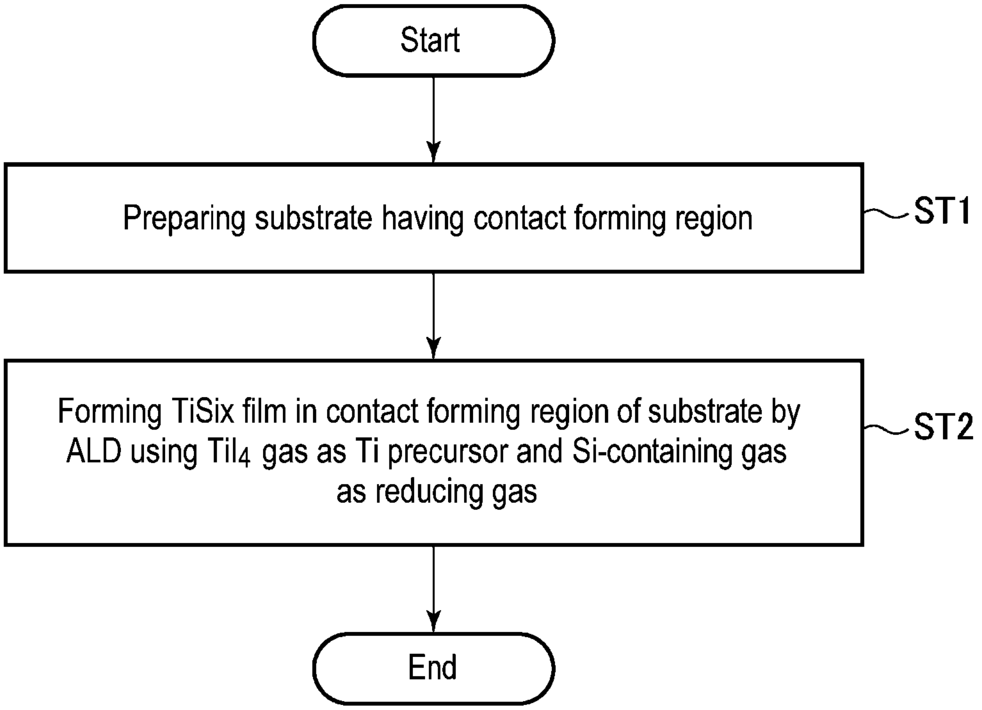
FIG. 1 is a flowchart showing a film forming method according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described with reference to the accompanying drawings.

<Background and Outline>

First, the background and outline of a film forming method according to the present disclosure will be described.

Since $TiSi_2$ and TiSi are present in titanium silicide, titanium silicide will be referred to as $TiSi_x$ including both $TiSi_2$ and TiSi in the following description.

When forming a $TiSi_x$ film used for Si contacts, from the viewpoint of reducing the risk of device failure due to thermal budget, it is required to lower a processing temperature. Especially, 450 degrees C. or less is required for a logic semiconductor having a low heat resistance. Further, along with miniaturization of semiconductor devices, especially in a logic semiconductor, the $TiSi_x$ film used for a Si contact is required to have a low resistance.

A Si contact is formed in an impurity diffusion region such as a source electrode or a drain electrode. However, when Ti is reacted with Si of a substrate (reduction reaction) by annealing to form a TiSix film as in Non-Patent Document 1, impurities added to Si due to the reaction between Ti and Si (reduction reaction) are also sucked up at the same time. Since a contact resistance is proportional to a resistance and Schottky barrier of a material and inversely proportional to an impurity concentration at a metal (Ti)—Si interface, when the impurities are sucked up from the impurity diffusion region and the impurity concentration is decreased, the contact resistance increases. Further, in Non-Patent Document 1, the processing temperature required for the reaction for forming $TiSi_x$ is as high as 650 degrees C. or higher. Therefore, it is difficult to apply the technique of Non-Patent Document 1 to a logic semiconductor.

In addition, in Patent Document 1, a $TiSi_x$ layer is epitaxially grown on a silicon substrate by ALD using $TiCl_4$ and $SiH_4$. However, a high film forming temperature is required. In addition, Non-Patent Document 2 describes that a $TiSi_2$ film is formed by CVD using $TiI_4$ and $SiH_4$. However, a substrate temperature at that time is as high as 650 degrees C.

Therefore, studies have been made to implement the recent demands for lowering the processing temperature and lowering the resistance of a $TiSi_x$ film constituting a Si contact. As a result, it was found that it is effective to directly form a $TiSi_x$ film on a contact forming region of a substrate by ALD using $TiI_4$ gas and a Si-containing gas.

<Film Formation Method>

Next, a film forming method according to an embodiment of the present disclosure will be described.

[First Embodiment of Film Forming Method]

FIG. 1 is a flowchart showing a film forming method according to a first embodiment of the present disclosure. As shown in FIG. 1, the film forming method according to the first embodiment includes a process (step ST1) of preparing a substrate having a contact forming region, and a process (step ST2) of forming a $TiSi_x$ film in the contact forming region of the substrate by ALD using $TiI_4$ gas as a Ti precursor and a Si-containing gas as a reducing gas.

Figure 2:
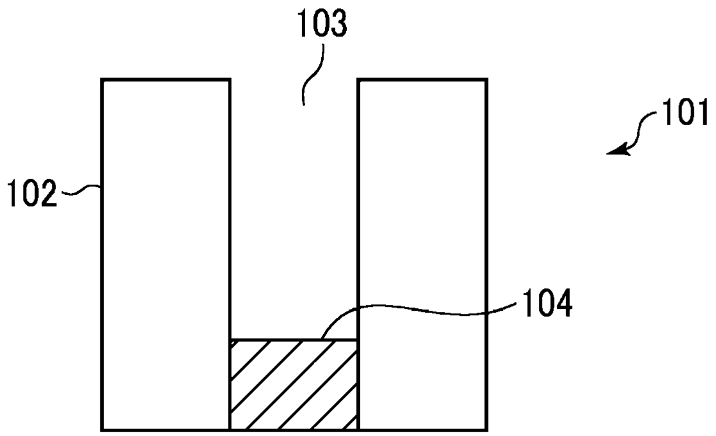
FIG. 2 is a cross-sectional view showing an example of a substrate.

The substrate prepared in step ST1 is configured as shown in FIG. 2. A substrate 101 is, for example, a semiconductor wafer (silicon wafer). In this example, a 3D device is formed on the substrate 101. Specifically, the substrate 101 has an insulating film 102 formed on a base (not shown), and a contact hole 103 is formed in the insulating film 102. A contact forming region 104 is exposed at a bottom of the contact hole 103. The contact forming region 104 is a silicon-containing region such as a source electrode or a drain electrode in which impurities such as B and the like are diffused, and is made of, for example, Si or SiGe formed by epitaxial growth. In this case, the contact forming region 104 may be epitaxially grown in a vertical direction or epitaxially grown in a sheet shape in a horizontal direction. Examples of the insulating film 102 includes a SiN film. The insulating film 102 may be a $SiO_2$ film. Although the 3D device is exemplified in FIG. 2, a general 2D device may be used in which case the contact forming region 104 may be a Si base.

Figure 3:
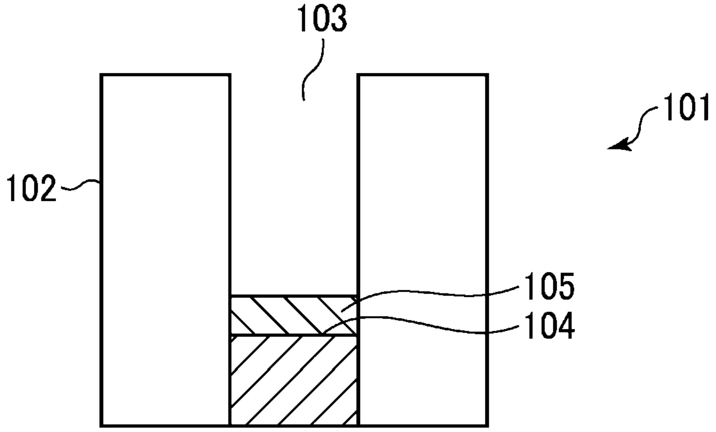
FIG. 3 is a cross-sectional view showing a state in which a $TiSi_x$ film is formed in a contact forming region at a bottom of a contact hole in the substrate shown in FIG. 2.

In step ST2, the $TiI_4$ gas, which is a Ti precursor, and the Si-containing gas, which is a reducing gas (siliciding gas), are sequentially (typically, alternately) supplied to the substrate 101 in a processing container. Thus, as shown in FIG. 3, a $TiSi_x$ film 105 as a Si contact is formed on a surface of the contact forming region 104.

Figure 4:
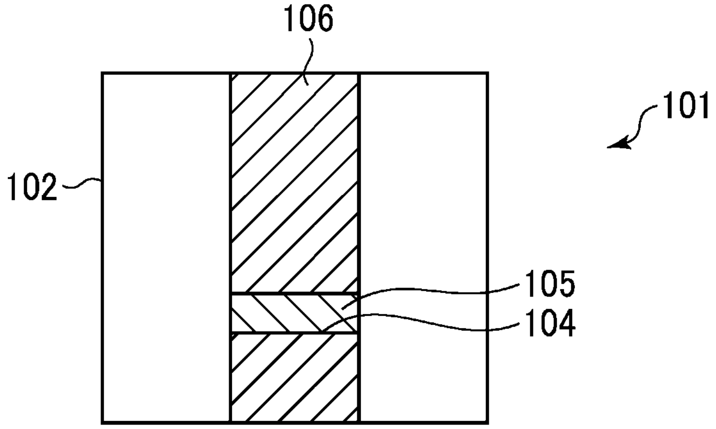
FIG. 4 is a cross-sectional view showing a state in which wiring is formed by embedding a wiring material into the contact hole in the substrate on which the $TiSi_x$ film of FIG. 3 is formed.

After forming the $TiSi_x$ film 105, as shown in FIG. 4, a low resistance wiring material such as Co, W, Mo, Ru, or the like is embedded in the contact hole 103 to form a wiring 106 on the $TiSi_x$ film 105. As a result, a desired semiconductor device can be obtained.

Prior to the film forming process of step ST2, a process of removing a natural oxide film formed on the surface of the contact forming region 104 may be performed. The natural oxide film can be removed by a precleaning process using Ar sputtering or the like.

In addition, after step ST2, a plasma process may be performed by $H_2$ plasma or the like.

Next, the film forming process of step ST2 will be described in detail.

Figure 5:
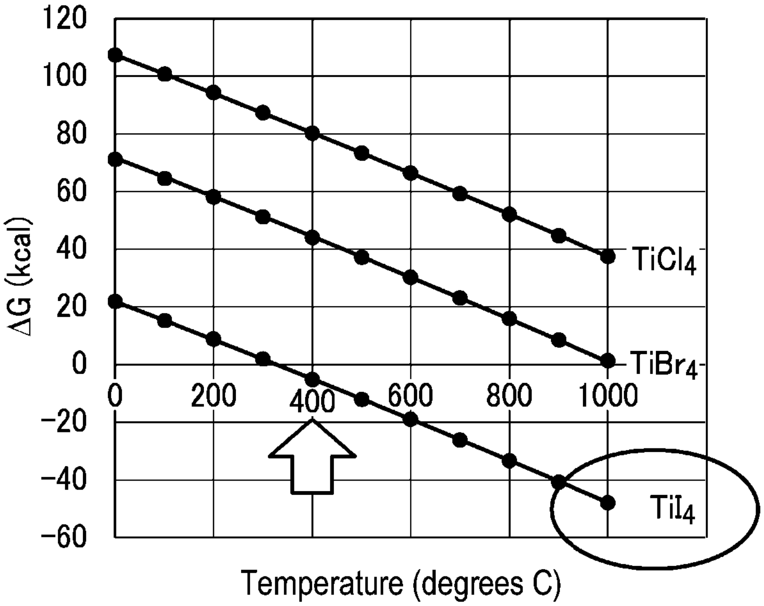
FIG. 5 is a diagram showing a simulation result of a relationship between a reaction temperature (degrees C.) and free energy ΔG (or free energy change) (kcal) when $TiI_4$, $TiBr_4$, and $TiCl_4$ are used as a Ti precursor and a $SiH_4$ gas is used as a Si compound.

In the formation of the $TiSi_x$ film 105 in step ST2, $TiI_4$ used as a Ti precursor has high reactivity. Therefore, the reaction with a Si compound gas can occur at a low temperature, and the $TiSi_x$ film can be formed at the low temperature. FIG. 5 is a diagram showing a simulation result of a relationship between a reaction temperature (degrees C.) and free energy ΔG (or free energy change) (kcal) when $TiI_4$, $TiBr_4$, and $TiCl_4$ are used as a Ti precursor and a $SiH_4$ gas is used as a Si compound. The following reactions (1) to (3) were used for simulation. In FIG. 5, it means that the reaction proceeds when ΔG becomes negative.

$$TiI_4(g)+2SiH_4(g)=TiSi_2+2I_2(g)+4H_2(g) \quad (1)$$

$$TiBr_4(g)+2SiH_4(g)=TiSi_2+2Br_2(g)+4H_2(g) \quad (2)$$

$$TiCl_4(g)+2SiH_4(g)=TiSi_2+2Cl_2(g)+4H_2(g) \quad (3)$$

As shown in the simulation result of FIG. 5, when $TiBr_4$ and $TiCl_4$ are used as the Ti precursor, a high temperature of 1000 degrees C. or higher is required for the film formation reaction to occur. On the other hand, when $TiI_4$ is used as the Ti precursor, ΔG becomes negative at substantially 350 degrees C., which indicates that the film can be formed at a low temperature of 450 degrees C. or lower.

When the $TiSi_x$ film is formed by ALD using the $TiI_4$ gas and the Si-containing gas as described above, film formation can be performed at the low temperature of 450 degrees C. or lower. Therefore, even in the case of a logic semiconductor, it is possible to reduce the risk of device defects due to thermal budget. Further, instead of forming silicide by a reaction with the underlying Si, the $TiSi_x$ film is directly formed on the contact forming region 104 by ALD. Therefore, it is possible to prevent impurities such as B and the like from being sucked up from the contact forming region 104. This makes it possible to reduce the resistance of the Si contact.

In addition, since an ALD method has high film thickness controllability, the $TiSi_x$ film can be made thin by forming the $TiSi_x$ film by ALD. A film thickness of the $TiSi_x$ film may be in a range of 0.5 nm to 10 nm.

Examples of the Si-containing gas used as the reducing gas include a silane-based gas, an iodide-based gas, a chloride-based gas, a bromide-based gas, and a fluoride-based gas, which are listed below.

Silane-based gas: $Si_2H_6$ and $SiH_4$

Iodide-based gas: $Si_2I_6$, $SiI_4$, $SiHI_3$, $SiH_2I_2$, and $SiH_3I$

Chloride-based gas: $Si_2Cl_6$, $SiCl_4$, $SiHCl_3$, $SiH_2Cl_2$, and $SiH_3Cl$

Bromide-based gas: $Si_2Br_6$, $SiBr_4$, $SiHBr_3$, $SiH_2Br_2$, and $SiH_3Br$

Fluoride-based gas: $Si_2F_6$, $SiF_4$, $SiHF_3$, $SiH_2F_2$, and $SiH_3F$

Among these gases, the $SiH_4$ gas is desirable from the viewpoint of reactivity. Further, since the iodide-based gas is the same type of gas as $TiI_4$, it has an advantage that impurities can be reduced.

In addition to the Si-containing gas, other reducing gases may be used. As other reducing gases, it may be possible to use $H_2$ gas, a deuterium-containing gas, and $NH_3$ gas. The deuterium-containing gas means a deuterium gas that is a gas of deuterium molecules in each which two deuterium atoms are bonded, or a gas of molecules in each which one protium atom and one deuterium atom are bonded. By using at least one of the $H_2$ gas, the deuterium-containing gas, and the $NH_3$ gas as other reducing gases in addition to the Si-containing gas, it is possible to allow the reduction reaction to proceed with ease. A supply timing of other reducing gases is not particularly limited. For example, other reducing gases may be supplied each time when the Si-containing gas is supplied, or may be supplied at a part of a timing of supplying the Si-containing gas, for example, once every several times. Of course, other reducing gases may be supplied at a timing different from the supply timing of the $SiH_4$ gas.

In step ST2, after supplying the $TiI_4$ gas and after supplying the Si-containing gas, a residual gas in the processing container is discharged by a purge gas. As the purge gas, an inert gas may be used. As the inert gas, $N_2$ gas or Ar gas may be desirably used. The purge gas may be continuously supplied during the film forming process.

A pressure in the processing container during step ST2 may be in a range of 13 Pa to 6,650 Pa (0.1 Torr to 50 Torr).

[Second Embodiment of Film Forming Method]

Figure 6:
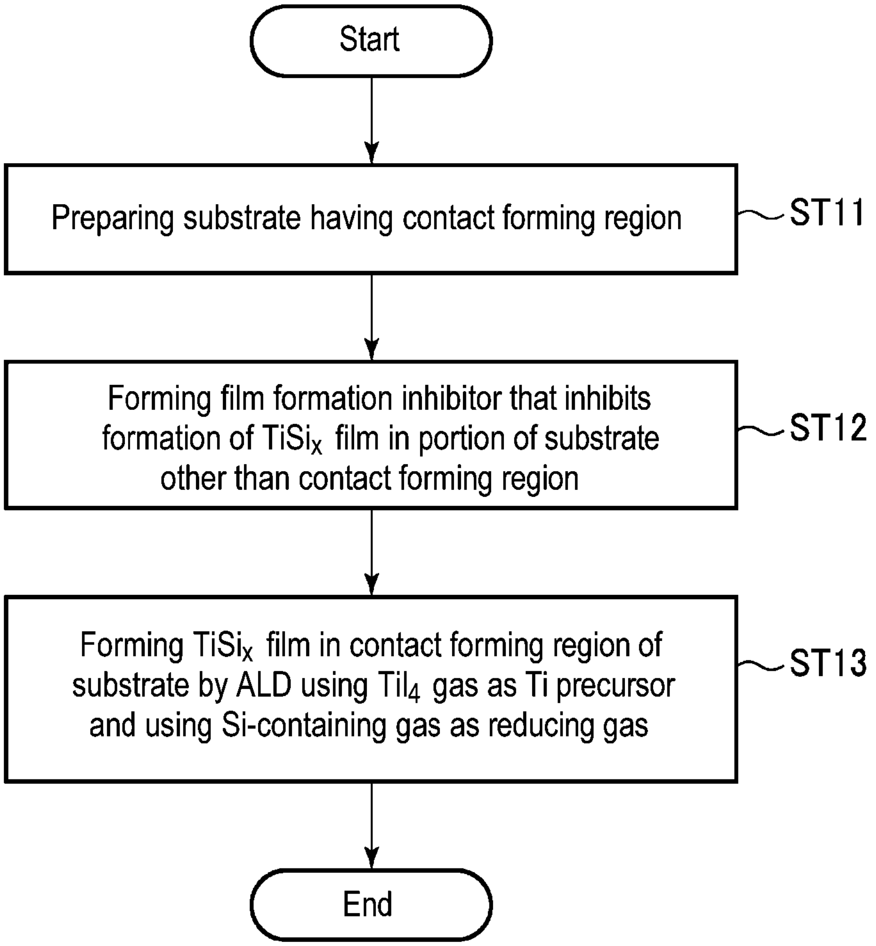
FIG. 6 is a flowchart showing a film forming method according to a second embodiment of the present disclosure.

FIG. 6 is a flowchart showing a film forming method according to a second embodiment of the present disclosure. As shown in FIG. 6, the film forming method according to the second embodiment includes a process (step ST11) of preparing a substrate having a contact forming region, a process (step ST12) of forming a film formation inhibitor that inhibits formation of a $TiSi_x$ film in a portion of the substrate other than the contact forming region, and a process (step ST13) of forming the $TiSi_x$ film in the contact forming region of the substrate by ALD using $TiI_4$ gas as a Ti precursor and using a Si-containing gas as a reducing gas.

In step ST11, as in step ST1, the substrate 101 shown in FIG. 2 may be used. In addition, in step ST13, the $TiSi_x$ film 105 is formed by ALD under basically the same condition as in step ST2.

Figure 7:
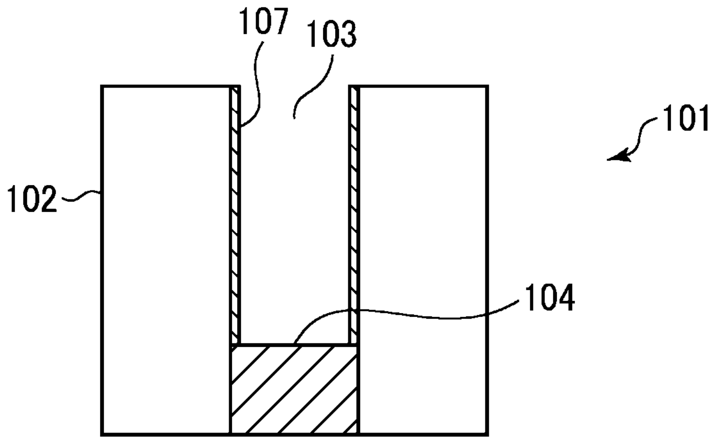
FIG. 7 is a cross-sectional view showing a state in which a film formation inhibitor is formed on the substrate of FIG. 2.
Figure 8:
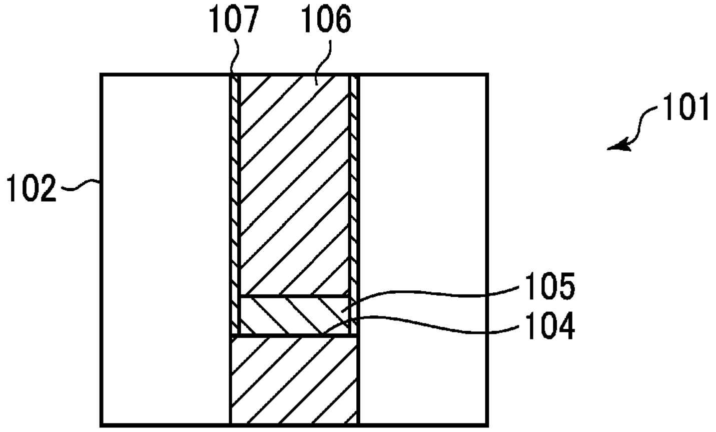
FIG. 8 is a diagram showing a state in which the film formation inhibitor is formed on the substrate of FIG. 2, the $TiSi_x$ film is formed, and then the wiring material is embedded into the contact hole.

As shown in FIG. 7, in the process of forming the film formation inhibitor in step ST12, a film formation inhibitor 107 that inhibits formation of the TiSix film on an inner surface of the contact hole 103 in the insulating film 102, i.e., on a region other than the contact forming region 104 is adsorbed. When the $TiSi_x$ film 105 is formed by ALD, the $TiSi_x$ film may also be formed on the inner surface of the contact hole 103 in the insulating film 102. Since $TiSi_x$ has a higher resistance than a wiring material, when the wiring material is embedded while the $TiSi_x$ film is present on the inner surface of the contact hole 103, the wiring resistance increases. Therefore, the film formation inhibitor 107 is adsorbed on the inner surface of the contact hole 103, which is a region other than the contact forming region 104, to suppress formation of the $TiSi_x$ film on that portion. Since the film formation inhibitor 107 is merely adsorbed, it can be formed extremely thin. As shown in FIG. 8, even when the wiring 106 is formed after forming the $TiSi_x$ film 105, the wiring resistance hardly increases.

As the film formation inhibitor 107, an organic substance that is easily adsorbed on the insulating film 102 is desirable. An alkyl halide or an alkene may be desirably used as the film formation inhibitor 107. An alkyl halide and an alkene are particularly easily adsorbed to a nitrogen-containing substance such as SiN or the like. The alkyl halide is represented by a general formula R—X (where R is an alkyl group and X is a halogen atom), and the alkene is a hydrocarbon (ethylene, propylene, isobutylene, or the like) having a carbon double bond.

Figure 9:
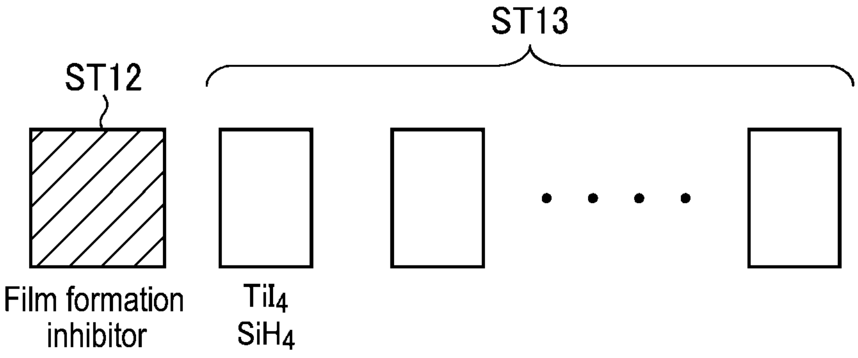
FIG. 9 is a diagram schematically showing a case where a process of forming the film formation inhibitor is performed prior to a process of forming the $TiSi_x$ film.
Figure 10:
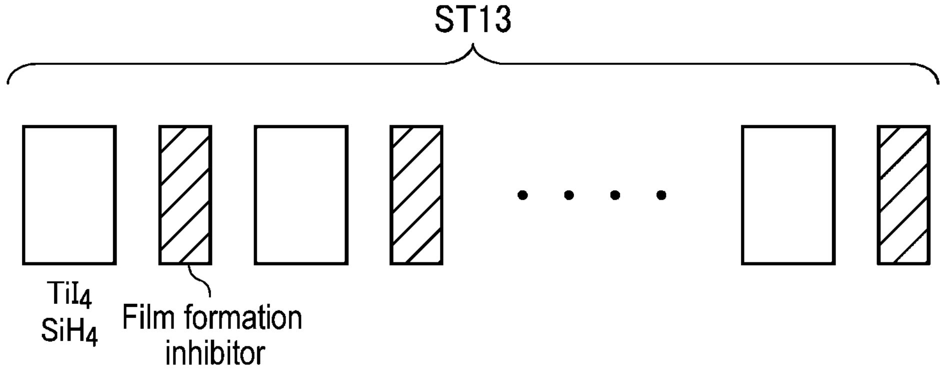
FIG. 10 is a diagram schematically showing an example in which the film formation inhibitor is sequentially supplied during an ALD cycle of the process of forming the $TiSi_x$ film.
Figure 11:
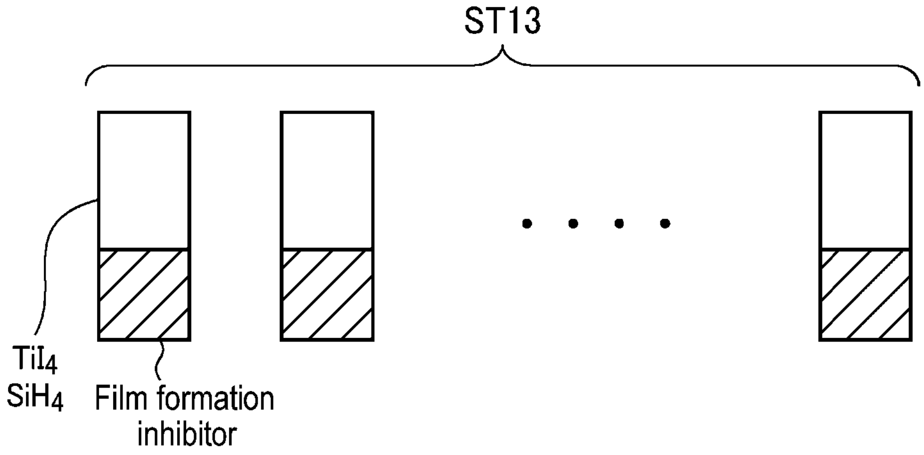
FIG. 11 is a diagram schematically showing an example in which the film formation inhibitor is simultaneously supplied when supplying one or both of the $TiI_4$ gas and the Si-containing gas ($SiH_4$ gas) in the process of forming the $TiSi_x$ film.

The process of forming the film formation inhibitor in step ST12 may be performed prior to the process of forming the $TiSi_x$ film in step ST13 as shown in FIG. 9, or may be performed during the process of forming the $TiSi_x$ film in ST13 as shown in FIGS. 10 and 11. The example of FIG. 10 is an example of sequentially supplying the film formation inhibitor during an ALD cycle when forming the $TiSi_x$ film. The example of FIG. 11 is an example of supplying the film formation inhibitor simultaneously when supplying one or both of the $TiI_4$ gas and the Si-containing gas (e.g., $SiH_4$ gas).

<Film Forming Apparatus>

Figure 12:
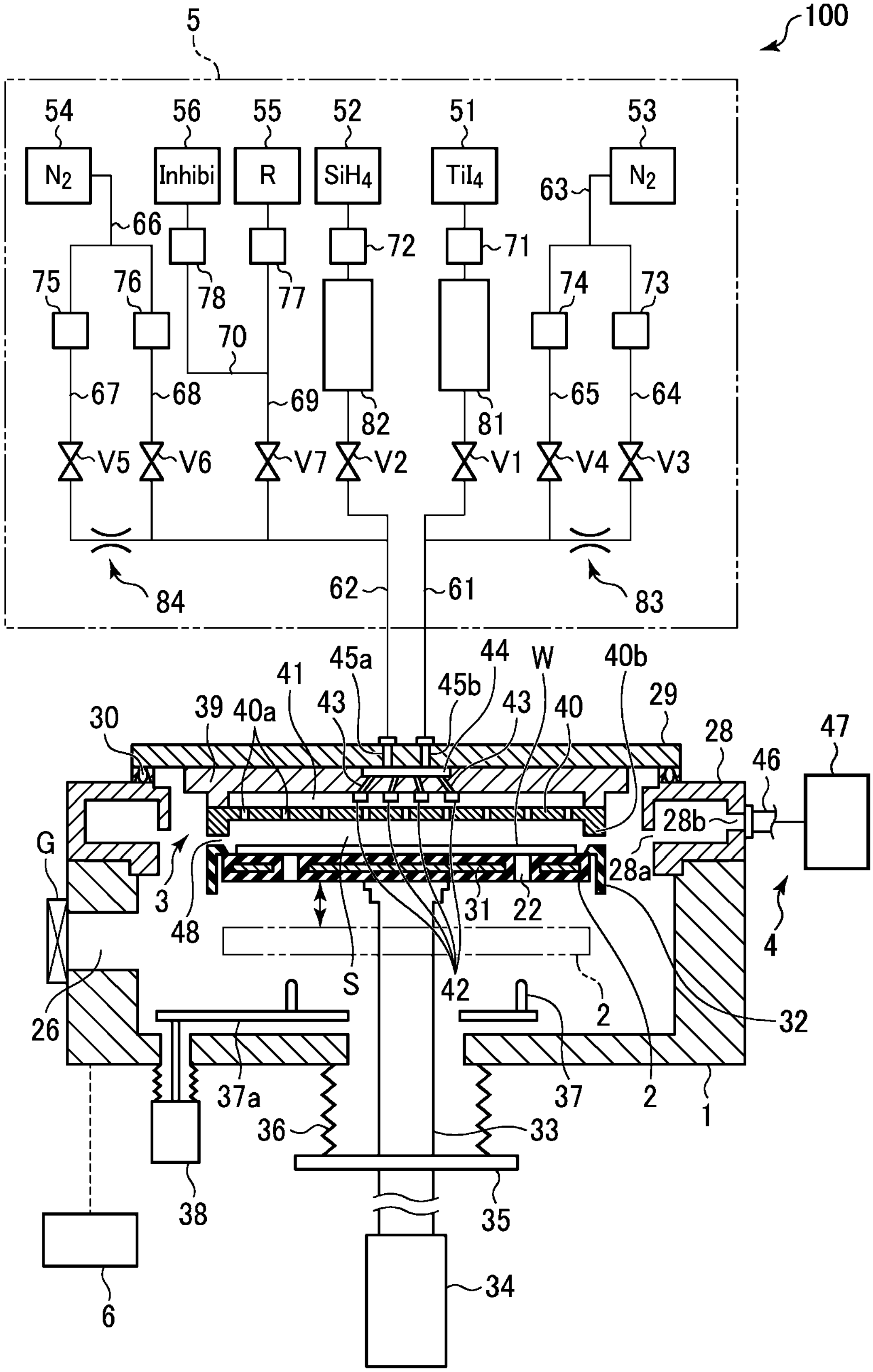
FIG. 12 is a cross-sectional view showing an example of a film forming apparatus used in a film forming method.

Next, an example of a film forming apparatus capable of carrying out the film forming method as described above will be described. FIG. 12 is a cross-sectional view showing an example of the film forming apparatus. An example is shown in which $SiH_4$ gas is used as a Si-containing gas and $N_2$ gas is used as an inert gas used for the purge or the like.

A film forming apparatus 100 includes a chamber 1 as a processing container, a susceptor (stage) 2, a shower head 3, an exhauster 4, a gas supply mechanism 5, and a controller 6.

The chamber 1, which is a processing container, includes a substantially cylindrical metal. A loading/unloading port 26 for loading and unloading a substrate W by a transfer mechanism (not shown) with respect to a vacuum transfer chamber (not shown) is formed on a side wall of the chamber 1. The loading/unloading port 26 can be opened and closed by a gate valve G.

An annular exhaust duct 28 having a rectangular cross section is provided on a main body of the chamber 1. A slit **28*a* is formed in the exhaust duct 28 along an inner peripheral surface thereof. In addition, an exhaust port 28*b* is formed on an outer wall of the exhaust duct 28. A top wall 29 is provided on an upper surface of the exhaust duct 28 so as to close an upper opening of the chamber 1. A space between the top wall 29 and the exhaust duct 28 is airtightly sealed by a seal ring 30**.

The susceptor 2 as a stage is used for placing the substrate W thereon in the chamber 1. As the substrate W, a semiconductor wafer (silicon wafer) having the structure shown in FIG. 2 described above is exemplified. The susceptor 2 has a disk shape having a size corresponding to the wafer W and is provided horizontally. The susceptor 2 is supported by a support 33. A heater 31 for heating the substrate W is embedded in the susceptor 2. The heater 31 is powered by a heater power supply (not shown) to generate heat. By controlling an output of the heater 31, a temperature of the substrate W is controlled to a desired temperature. The susceptor 2 is provided with a ceramic cover 32 so as to cover an outer peripheral region of the wafer mounting surface and a side surface.

The support 33 that supports the susceptor 2 extends from a center of a bottom surface of the susceptor 2 to below the chamber 1 via a hole formed in a bottom wall of the chamber 1. A lower end of the support 33 is connected to an elevating mechanism 34. The susceptor 2 can be moved up and down by the elevating mechanism 34 via the support 33 between a processing position shown in FIG. 2 and a transfer position below the processing position, which is indicated by a two-dot chain line and at which wafer transfer can be carried out. Further, a flange 35 is attached to the support 33 at a position below the chamber 1. A bellows 36 that isolates an atmosphere inside the chamber 1 from the external air and expands and contracts along with the vertical movement of the susceptor 2 is provided between the bottom surface of the chamber 1 and the flange 35.

In a vicinity of the bottom surface of the chamber 1, three wafer support pins 37 (only two of which are shown) are provided so as to protrude upward from a lift plate 37*a*. The wafer support pins 37 can be raised and lowered via the lift plate 37*a* by a lift mechanism 38 provided below the chamber 1. The wafer support pins 37 are inserted into through-holes 22 provided in the susceptor 2 located at the transfer position so that they can protrude and retract with respect to the upper surface of the susceptor 2. As a result, the substrate W is delivered between a wafer transfer mechanism (not shown) and the susceptor 2.

A heater (not shown) is embedded inside the wall of the chamber 1, and is configured to control a temperature of an inner wall of the chamber 1 to substantially 100 degrees C. to 350 degrees C. to prevent the $TiSi_x$ film from adhering to the inner wall of the chamber 1.

The shower head 3 is used for supplying a processing gas into the chamber 1 in a shower shape, and is provided at an upper portion of the chamber 1 so as to face the susceptor 2. The shower head 3 has substantially the same diameter as the susceptor 2. The shower head 3 includes a main body 39 fixed to the top wall 29 of the chamber 1 and a shower plate 40 connected to the main body 39 from below. A gas diffusion space 41 is formed between the main body 39 and the shower plate 40.

A plurality of gas dispersion members 42 is provided in the gas diffusion space 41. A plurality of gas discharge holes is formed around the gas dispersion members 42. The gas dispersion members 42 are connected to one ends of a plurality of gas supply paths 43 provided in the main body 39, respectively. The other ends of the gas supply paths 43 are connected to a diffusion portion 44 formed at a center of an upper surface of the main body 39. In addition, two gas introduction holes 45*a* and 45*b* penetrating from the upper surface of the main body 39 to the diffusion portion 44 are provided at a central portion of the main body 39.

An annular protrusion 40*b* protruding downward is formed on a peripheral edge of the shower plate 40. Gas discharge holes 40*a* are formed on a flat surface of the shower plate 40 inward of the annular protrusion 40*b*. When the susceptor 2 is located at the processing position, a processing space S is formed between the shower plate 40 and the susceptor 2, and the annular protrusion 40*b* and the upper surface of the cover 32 of the susceptor 2 are close to each other to form an annular gap 48.

The exhauster 4 includes an exhaust pipe 46 connected to the exhaust port 28*b* of the exhaust duct 28, and an exhaust mechanism 47 connected to the exhaust pipe 46 and provided with a vacuum pump, a pressure control valve, and the like. During the processing, the gas in the chamber 1 reaches the exhaust duct 28 via the slit 28*a*, and is exhausted from the exhaust duct 28 via the exhaust pipe 46 by the exhaust mechanism 47 of the exhauster 4.

The processing gas supply mechanism 5 includes a $TiI_4$ gas source 51 for supplying $TiI_4$ gas as a Ti precursor, and a $SiH_4$ gas source 52 for supplying $SiH_4$ gas as a reducing gas (siliciding gas). The processing gas supply mechanism 5 further includes a first $N_2$ gas source 53 and a second $N_2$ gas source 54 for supplying $N_2$ gas as a purge gas, an R gas source 55 for supplying other reducing gases (also referred to as R gas) such as $H_2$ gas, a deuterium-containing gas, and $NH_3$ gas, and a film formation inhibitor source 56 for supplying a film formation inhibitor.

A $TiI_4$ gas supply line 61 extends from the $TiI_4$ gas source 51, and a $SiH_4$ gas supply line 62 extends from the $SiH_4$ gas source 52. The other ends of the $TiI_4$ gas supply line 61 and the $SiH_4$ gas supply line 62 are connected to the gas introduction holes 45*a* and 45*b*, respectively.

A first $N_2$ gas supply line 63 that supplies $N_2$ gas toward the $TiI_4$ gas supply line 61 is connected to the first $N_2$ gas source 53. In addition, a second $N_2$ gas supply line 66 that supplies $N_2$ gas toward the $SiH_4$ gas supply line 62 is connected to the second $N_2$ gas source 54.

The first $N_2$ gas supply line 63 is branched into a first continuous $N_2$ gas supply line 64 that constantly supplies $N_2$ gas during the ALD film formation, and a first flash purge line 65 that supplies $N_2$ gas only during a purge process. In addition, the second $N_2$ gas supply line 66 is branched into a second continuous $N_2$ gas supply line 67 that constantly supplies $N_2$ gas during the ALD film formation, and a second flash purge line 68 that supplies $N_2$ gas only during the purge process. The other end of the first continuous $N_2$ gas supply line 64 is connected to the $TiI_4$ gas supply line 61, and the other end of the first flash purge line 65 is connected to the first continuous $N_2$ gas supply line 64. The other end of the second continuous $N_2$ gas supply line 67 is connected to the $SiH_4$ gas supply line 62, and the other end of the second flash purge line 68 is connected to the second continuous $N_2$ gas supply line 67. Since the first flash purge line 65 and the second flash purge line 68 have large flow rate capacities, orifices 83 and 84 for preventing backflow are provided in the first continuous $N_2$ gas supply line 64 and the second continuous $N_2$ gas supply line 67, respectively.

An R gas supply line 69 extends from the R gas source 55, and a film formation inhibitor supply line 70 extends from the film formation inhibitor source 56. The other end of the R gas supply line 69 is connected to the second continuous $N_2$ gas supply line 67, and the other end of the film formation inhibitor supply line 70 is connected to the R gas supply line 69.

A valve V1, a buffer tank 81, and a flow meter 71 are installed in the $TiI_4$ gas supply line 61 sequentially from a downstream side. Further, a valve V2, a buffer tank 82, and a flow rate controller 72 are installed in the $SiH_4$ gas supply line 62 sequentially from the downstream side. The buffer tanks 81 and 82 are used for temporarily storing the respective gases. By storing the gases, increasing internal pressures of the buffer tanks 81 and 82, and then supplying the stored gases, the buffer tanks 81 and 82 can supply the gases into the chamber 1 at a large flow rate. Buffer tanks may be provided on the first and second flash purge lines 65 and 68 that supply $N_2$ gas at a large flow rate.

In the first continuous $N_2$ gas supply line 64, the first flash purge line 65, the second continuous $N_2$ gas supply line 67, and the second flash purge line 68, valves V3, V4, V5, and V6 are installed on a downstream side, and flow rate controllers 73, 74, 75 and 76 are installed on an upstream side, respectively. Flow rate controllers 77 and 78 are installed in the R gas supply line 69 and the film formation inhibitor supply line 70, respectively. In addition, a valve V7 is installed in the R gas supply line 69 on a downstream side of a merging point of the film formation inhibitor supply line 70.

The valves V1 to V7 function as ALD valves for switching gases during the ALD process, and are composed of high-speed valves that can be opened and closed at a high speed.

Although not shown, the gas supply mechanism 5 further includes a $ClF_3$ gas supply line that supplies $ClF_3$ gas as a cleaning gas for cleaning an interior of the chamber 1. The gas supply mechanism 5 further includes a bottom $N_2$ gas supply line that supplies $N_2$ gas from the bottom of the chamber 1.

Figure 13:
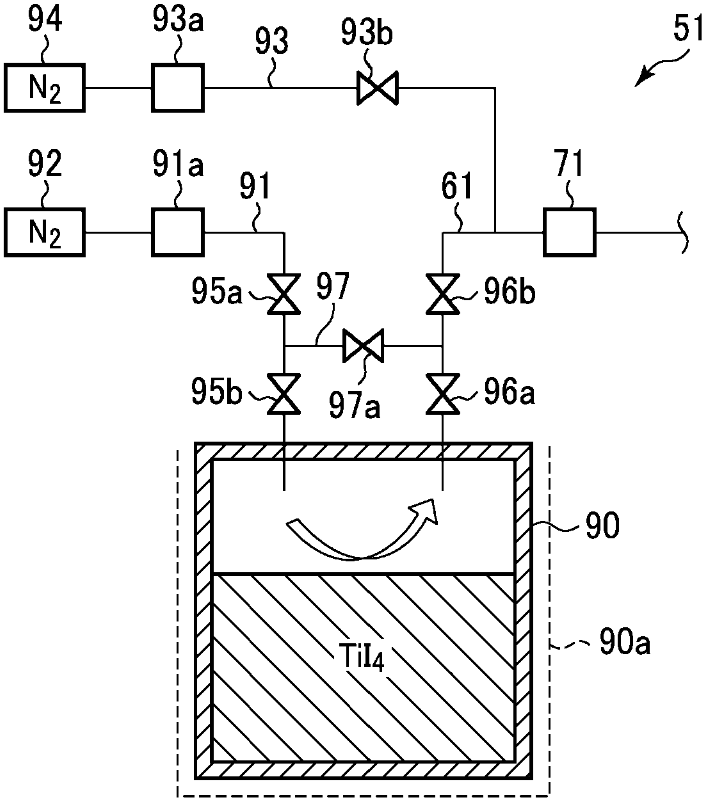
FIG. 13 is a diagram showing a $TiI_4$ gas source in the film forming apparatus of FIG. 12.

Since $TiI_4$ is in a solid state at room temperature, as shown in FIG. 13, the $TiI_4$ gas source 51 has a function of sublimating solid $TiI_4$. Specifically, the $TiI_4$ gas source 51 includes a solid raw material tank 90 that stores $TiI_4$ which is in a solid state at room temperature. A heater 90*a* is provided around the solid raw material tank 90 to heat the $TiI_4$ in the tank 90 to an appropriate temperature to sublimate the $TiI_4$.

A carrier gas pipe 91 for supplying $N_2$ gas as a carrier gas, is inserted into the solid raw material tank 90 from above. A carrier $N_2$ gas source 92 is connected to the carrier gas pipe 91. A flow rate controller 91*a* is installed in the carrier gas pipe 91. In addition, the above-mentioned $TiI_4$ gas supply line 61 is inserted into the solid raw material tank 90 from above. The $TiI_4$ gas supply line 61 is provided with a heater (not shown) for preventing condensation of the $TiI_4$ gas. The $TiI_4$ gas sublimated in the solid raw material tank 90 is transferred by the carrier $N_2$ gas and supplied to the $TiI_4$ gas supply line 61. An offset $N_2$ gas supply line 93 is connected to the $TiI_4$ gas supply line 61 at a portion on an upstream side of the flow meter 71, and an $N_2$ gas source 94 is connected to the offset $N_2$ gas supply line 93. The offset $N_2$ gas supply line 93 is provided with a flow rate controller 93*a* and a valve 93*b*. A flow rate of the $TiI_4$ gas is adjusted by the flow rate controller 91*a* of the carrier gas pipe 91 and the flow rate controller 93*a* of the offset $N_2$ gas supply line 93.

The carrier gas pipe 91 and the $TiI_4$ gas supply line 61 are connected by a bypass pipe 97. A valve 97*a* is installed in the bypass pipe 97. A valve 95*a* and a valve 95*b* are installed in the carrier gas pipe 91 on an upstream side and a downstream side of the connection point of the bypass pipe 97, respectively. In addition, a valve 96*a* and a valve 96*b* are installed in the $TiI_4$ gas supply line 61 on an upstream side and a downstream side of the connection point of the bypass pipe 97, respectively. Thus, by closing the valves 95*b* and 96*a* and opening the valves 95*a*, 96*b*, and 97*a*, the $N_2$ gas from the carrier $N_2$ gas source 93 can be supplied via the carrier gas pipe 91 and the bypass pipe 97 to purge the $TiI_4$ gas supply line 61. The $TiI_4$ gas supply line 61 can also be purged by the $N_2$ gas supplied from the offset $N_2$ gas supply line 93.

At the time of purging the interior of the chamber 1, a flash purge $N_2$ gas can be supplied from the first flash purge line 65 and the second flash purge line 68 to strengthen the purging. However, it is not essential to provide the first and second flash purge lines 65 and 68. Likewise, the buffer tanks 81 and 82 are not essential.

The controller 6 is composed of a computer, and includes a main controller equipped with a CPU, an input device (keyboard, mouse, etc.), an output device (printer, etc.), a display device (display, etc.), and a memory device (non-transitory computer-readable storage medium). The main controller controls operations of respective components, for example, opening and closing the valves V1 to V7, adjusting the gas flow rates by the flow rate controllers 72 to 78, regulating the pressure in the chamber 1 by the pressure control valve, adjusting the temperature of the substrate W by the heater 31, and the like. The control of these operations is executed by a process recipe which is a control program stored in the storage medium (hard disk, optical desk, semiconductor memory, etc.) built in the memory device.

In the film forming apparatus 100 configured as described above, under the control of the controller 6, the heater 31 heats the substrate W so that the temperature of the substrate W placed on the susceptor 2 is set to be 450 degrees C. or lower, for example, 350 degrees C.

In such a state, first, the gate valve G is opened. The substrate W is loaded into the chamber 1 from a vacuum transfer chamber (not shown) by a transfer device (not shown), and is placed on the susceptor 2. When necessary, prior to the transfer of the substrate W to the chamber 1, a natural oxide film may be removed from the substrate W by performing a precleaning process or the like in a separate chamber.

After placing the substrate W and retreating the transfer device, the gate valve G is closed and the susceptor 2 is raised to the processing position. Subsequently, the interior of the chamber 1 is exhausted by the exhauster 4, and the valves V3 and V5 are opened to continuously supply $N_2$ gas into the processing space S of the chamber 1 via the first continuous $N_2$ gas supply line 64 and the second continuous $N_2$ gas supply line 67. As a result, the interior of the chamber 1 is maintained at a reduced pressure of 13 Pa to 6,650 Pa (0.1 Torr to 50 Torr), and the temperature of the substrate W on the susceptor 2 is stabilized at a desired temperature of 450 degrees C. or lower, for example, 350 degrees C.

Thereafter, while maintaining the state of continuously supplying the $N_2$ gas, the valves V1 and V2 of the $TiI_4$ gas supply line 61 and the $SiH_4$ gas supply line 62 are operated to supply the $TiI_4$ gas and the $SiH_4$ gas alternately and intermittently. Thus, a $TiSi_x$ film is formed in the contact forming region of the substrate W by ALD.

Figure 14:
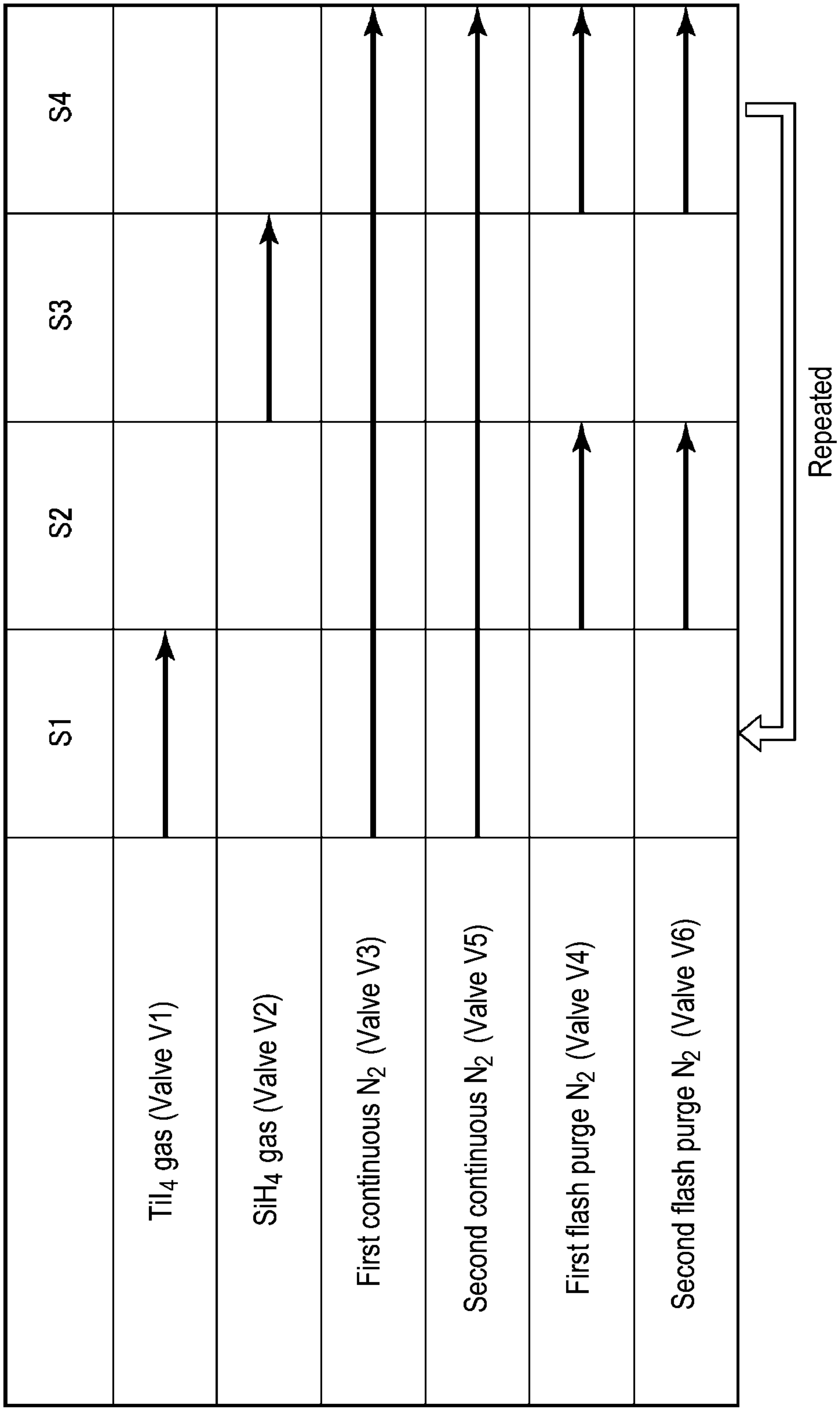
FIG. 14 is a diagram showing an example of a gas supply sequence when the $TiSi_x$ film is formed by the film forming apparatus of FIG. 12.

FIG. 14 is a diagram showing an example of a gas supply sequence when a $TiSi_x$ film is formed by the film forming apparatus of FIG. 12.

During the process, the valves V3 and V5 are kept open to continuously supply $N_2$ gas via the first continuous $N_2$ gas supply line 64 and the second continuous $N_2$ gas supply line 67. Then, the valve V1 is first opened to supply $TiI_4$ gas to the processing space S in the chamber 1 via the $TiI_4$ gas supply line 61 (operation Si). As a result, the $TiI_4$ gas is adsorbed on the surface of the substrate W. At this time, the $TiI_4$ gas is temporarily stored in the buffer tank 81, subjected to a pressure increase, and then supplied into the chamber 1.

Subsequently, the valve V1 is closed to stop the supply of the $TiI_4$ gas, and the interior of the processing space S of the chamber 1 is purged (operation S2). In the purge process performed at this time, the valves V4 and V6 are opened to supply $N_2$ gas (flash purge $N_2$ gas) from the first flash purge line 65 and the second flash purge line 68, in addition to the continuously supplied $N_2$ gas. As a result, the excessive $TiI_4$ gas or the like in the processing space S can be quickly discharged by the $N_2$ gas supplied at a large flow rate.

Subsequently, the valves V4 and V6 are closed to stop the supply of the flash purge $N_2$ gas, and the valve V2 is opened to supply $SiH_4$ gas to the processing space S in the chamber 1 via the $SiH_4$ gas supply line 62 (operation S3). As a result, the adsorbed $TiI_4$ gas and the $SiH_4$ gas react with each other. At this time, the $SiH_4$ gas is temporarily stored in the buffer tank 82, subjected to a pressure increase, and then supplied into the chamber 1.

Subsequently, the valve V2 is closed to stop the supply of the $SiH_4$ gas, and the interior of the processing space S of the chamber 1 is purged (operation S4). In the purge process performed at this time, the valves V4 and V6 are opened to supply $N_2$ gas (flash purge $N_2$ gas) from the first flash purge line 65 and the second flash purge line 68, in addition to the continuously supplied $N_2$ gas. As a result, the excessive $SiH_4$ gas or the like in the processing space S can be quickly discharged by the $N_2$ gas supplied at a large flow rate.

By performing one cycle of the above operations S1 to S4 in a short time, a thin $TiSi_x$ unit film is formed, and by repeating the cycle of the steps described above a predetermined number of times, a $TiSi_x$ film having a desired film thickness is formed. The film thickness of the $TiSi_x$ film formed at this time can be controlled by the repetition number of the cycle.

By using other reducing gases such as $H_2$ gas, a deuterium-containing gas, and $NH_3$ gas supplied from the R gas source 55 in addition to the $SiH_4$ gas, it is possible to allow the reduction reaction to proceed with ease. The supply timing of other reducing gases is not particularly limited. For example, other reducing gases may be supplied each time when the Si-containing gas is supplied, or may be supplied at a part of the timing of supplying the Si-containing gas, for example, once every several times. In addition, other reducing gases may be supplied at the supply timing of the $TiI_4$ gas, or may be supplied at a timing different from the supply timing of the $SiH_4$ gas or the $TiI_4$ gas.

The film formation inhibitor from the film formation inhibitor source 56 may be supplied as needed. By supplying the film formation inhibitor, as described above, the film formation inhibitor can be adsorbed to the region where the $TiSi_x$ film is desired not to be formed, thereby suppressing formation of the $TiSi_x$ film in that region. The film formation inhibitor can be supplied after the substrate W is placed on the susceptor 2 and before the $TiSi_x$ film is formed by ALD. In addition, the film formation inhibitor may be supplied when the $TiSi_x$ film is formed by ALD. For example, the film formation inhibitor may be sequentially supplied after the operation S2 or after the operation S4, or may be supplied when supplying the $TiI_4$ gas in the operation Si or when supplying the $SiH_4$ gas in the operation S3. The film formation inhibitor may be supplied both when supplying the $TiI_4$ gas and when supplying the $SiH_4$ gas.

After the processing of one substrate W is completed, the interior of the chamber 1 is purged with $N_2$ gas, and the susceptor 2 is lowered to the transfer position. Subsequently, the gate valve G is opened, the transfer device is inserted into the chamber 1 from the vacuum transfer chamber, and the substrate W on the susceptor 2 is unloaded from the chamber 1.

The substrate W on which the $TiSi_x$ film is formed may be transferred to another chamber and subjected to a plasma process using $H_2$ plasma or the like.

In the film forming apparatus 100, after the film forming process on a certain number of substrates W is completed, $ClF_3$ gas may be supplied as a cleaning gas from the $ClF_3$ gas supply line to clean the interior of the chamber 1. The cleaning process is performed by supplying the $ClF_3$ gas into the chamber 1 in a state in which the substrate W does not exist in the chamber 1. The inner wall of the chamber 1 is heated to substantially 100 degrees C. to 350 degrees C., and adhesion of a $TiSi_x$ film is suppressed. However, the adhesion of the $TiSi_x$ film cannot be completely eliminated. Therefore, the $TiSi_x$ film adhering to the inner wall of the chamber 1 is removed by the $ClF_3$ gas.

In the formation of the $TiSi_x$ film by ALD in the film forming apparatus 100 as described above, the $TiI_4$ gas having good reactivity is adsorbed on the substrate W at substantially one molecular layer with good controllability, and then the $TiI_4$ gas is reacted with the $SiH_4$ gas to form an extremely thin $TiSi_x$ unit film. This operation is repeated a plurality of times. Therefore, it is possible to form the $TiSi_x$ film at a low temperature of 450 degrees C. or lower. In addition, due to the high controllability, it is possible to form a thin $TiSi_x$ film of 0.5 nm to 10 nm. In addition, since the $TiSi_x$ film is directly formed in the contact forming region by ALD, it is possible to suppress impurities from being suctioned from the contact forming region and to reduce a resistance of the Si contact.

In addition, since the $N_2$ gas (flash purge $N_2$ gas) is supplied from the first flash purge line 65 and the second flash purge line 68 in addition to the continuously supplied $N_2$ gas supplied in the purge process of the operations S2 and S4, the gas replaceability is high. Therefore, the purge process can be performed in a short period of time, and the controllability of the film thickness can be improved. In addition, the buffer tanks 81 and 82 are provided in the $TiI_4$ gas supply line 61 and the $SiH_4$ gas supply line 62, respectively, so that the $TiI_4$ gas and the $SiH_4$ gas can be temporarily stored therein and then discharged. Therefore, the $TiI_4$ gas and the $SiH_4$ gas can be easily supplied in a short time. Even when one cycle is short, it is possible to reliably supply a required amount of the $TiI_4$ gas and the $SiH_4$ gas.

OTHER APPLICATIONS

Although the embodiments of the present disclosure have been described above, the embodiments disclosed herein should be considered to be exemplary and not limitative in all respects. The above-described embodiments may be omitted, replaced, or modified in various forms without departing from the scope of the appended claims and their gist.

For example, in the above-described embodiments, the case where the $TiSi_x$ film is formed in the contact forming region of the logic semiconductor has been mainly described. However, the present disclosure may be applied to a contact forming region of a memory semiconductor such as a DRAM or a 3D NAND.

In addition, the film forming apparatus shown in FIG. 12 is an example only. The film forming apparatus may be a sheet-by-sheet type film forming apparatus having a structure different from that shown in FIG. 12, or a batch type film forming apparatus for forming films on a plurality of substrates at once. In addition, the film forming apparatus may be a film forming apparatus that implements an ALD method by a relative movement between a gas supply region and a substrate. Examples of such a film forming apparatus include a semi-batch-type film forming apparatus in which a plurality of substrates is placed on a rotatable stage and ALD film formation is implemented by allowing the substrates to pass through respective gas supply regions while rotating the stage. In addition, a semi-batch type film forming apparatus in which a plurality of substrates is placed on a non-rotating stage to perform ALD film formation may be used.

In addition, in the above-described embodiments, the semiconductor wafer has been described as an example of the substrate. However, the substrate is not limited to the semiconductor wafer and may be any substrate having a contact forming region in which a Si contact is formed. For example, the substrate may be a glass substrate used for a flat panel display (FPD) or other substrates such as a ceramic substrate and the like.

According to the present disclosure in some embodiments, it is possible to form a low-resistance titanium silicide film at a low temperature.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method of forming a titanium silicide film in a contact forming region of a substrate, the film forming method comprising:

- preparing the substrate in which an insulating film having a contact hole is formed on a base of the substrate and the contact forming region is exposed at a bottom of the contact hole;
- selectively adsorbing a film formation inhibitor, which inhibits formation of the titanium silicide film, on a portion of the substrate such that an inner surface of the contact hole other than the contact forming region is entirely covered by the film formation inhibitor; and
- forming the titanium silicide film in the contact forming region of the substrate by atomic layer deposition (ALD) by sequentially supplying $TiI_4$ gas as a Ti precursor and a Si-containing gas as a reducing gas to the substrate,
- wherein the forming the titanium silicide film is performed while a temperature of the substrate is set to be 450 degrees C. or lower at which a free energy change of a reaction between the $TiI_4$ gas and the Si-containing gas becomes negative, such that the reaction proceeds.

2. The film forming method of claim 1, wherein the contact forming region is a silicon-containing region in which impurities are diffused.

3. The film forming method of claim 2, wherein the contact forming region is a region in which Si or SiGe is epitaxially grown.

4. The film forming method of claim 2, wherein the film formation inhibitor is an alkyl halide or an alkene.

5. The film forming method of claim 2, wherein the selectively adsorbing the film formation inhibitor is performed prior to the forming the titanium silicide film or during the forming the titanium silicide film.

6. The film forming method of claim 1, wherein the Si-containing gas is selected from the group consisting of $Si_2H_6$, $SiH_4$, $Si_2I_6$, $SiI_4$, $SiHI_3$, $SiH_2I_2$, $SiH_3I$, $Si_2Cl_6$, $SiCl_4$, $SiHC_{13}$, $SiH_2Cl_2$, $SiH_3Cl$, $Si_2Br_6$, $SiBr_4$, $SiHBr_3$, $SiH_2Br_2$, $SiH_3Br$, $Si_2F_6$, $SiF_4$, $SiHF_3$, $SiH_2F_2$, and $SiH_3F$.

7. The film forming method of claim 1, wherein the forming the titanium silicide film includes supplying at least one gas selected from the group of $H_2$ gas, a deuterium-containing gas, and $NH_3$ gas as the reducing gas in addition to the Si-containing gas.

8. A method of manufacturing a semiconductor device, comprising:

- preparing a substrate in which an insulating film having a contact hole is formed on a base of the substrate and a contact forming region, which is an impurity-diffused silicon-containing region, is exposed at a bottom of the contact hole;
- selectively adsorbing a film formation inhibitor, which inhibits formation of a titanium silicide film, on a portion of the substrate other than the contact forming region;
- forming the titanium silicide film as a silicon contact in the contact forming region of the substrate by atomic layer deposition (ALD) by sequentially supplying $TiI_4$ gas as a Ti precursor and a Si-containing gas as a reducing gas to the substrate; and
- forming a wiring on the titanium silicide film by embedding a wiring material in the contact hole,
- wherein the forming the titanium silicide film is performed while a temperature of the substrate is set to be 450 degrees C. or lower at which a free energy change of a reaction between the $TiI_4$ gas and the Si-containing gas becomes negative, such that the reaction proceeds.

9. The method of claim 8, wherein the contact forming region is a region in which Si or SiGe is epitaxially grown.

10. The method of claim 8, wherein the film formation inhibitor is an alkyl halide or an alkene.

11. The method of claim 8, wherein the selectively adsorbing the film formation inhibitor is performed prior to the forming the titanium silicide film or during the forming the titanium silicide film.

12. The method of claim 8, wherein the wiring material is selected from the group consisting of Co, W, Mo, and Ru.

13. The method of claim 8, wherein the Si-containing gas is selected from the group consisting of $Si_2H_6$, $SiH_4$, $Si_2I_6$, $SiI_4$, $SiHI_3$, $SiH_2I_2$, $SiH_3I$, $Si_2Cl_6$, $SiCl_4$, $SiHCl_3$, $SiH_2Cl_2$, $SiH_3Cl$, $Si_2Br_6$, $SiBr_4$, $SiHBr_3$, $SiH_2Br_2$, $SiH_3Br$, $Si_2F_6$, $SiF_4$, $SiHF_3$, $SiH_2F_2$, and $SiH_3F$.

14. The method of claim 8, wherein the forming the titanium silicide film includes supplying at least one gas selected from the group of $H_2$ gas, a deuterium-containing gas, and $NH_3$ gas as the reducing gas in addition to the Si-containing gas.

* * * * *